(12) United States Patent
Manikandan et al.

(10) Patent No.: US 10,732,206 B2
(45) Date of Patent: Aug. 4, 2020

(54) CURRENT SENSOR AND METHOD OF ASSEMBLY

(71) Applicant: ABB Schweiz AG, Baden (CH)

(72) Inventors: Madanambeti Manikandan, Hyderabad (IN); Mayukha Pal, Hyderabad (IN); Giriprasad Venkateswaran, Hyderabad (IN); Vishwas Gurung, Hyderabad (IN)

(73) Assignee: ABB Schweiz AG, Baden (CH)

( * ) Notice: Subject to any disclaimer, the term of this patent is extended or adjusted under 35 U.S.C. 154(b) by 72 days.

(21) Appl. No.: 15/992,763

(22) Filed: May 30, 2018

(65) Prior Publication Data

US 2019/0302151 A1    Oct. 3, 2019

(30) Foreign Application Priority Data

Apr. 2, 2018  (IN) .............................. 201841012448

(51) Int. Cl.
| | |
|---|---|
| *G01R 15/18* | (2006.01) |
| *H01F 27/24* | (2006.01) |
| *H01F 27/28* | (2006.01) |
| *H02H 1/00* | (2006.01) |

(52) U.S. Cl.
CPC ........... *G01R 15/181* (2013.01); *H01F 27/24* (2013.01); *H01F 27/2823* (2013.01); *H02H 1/0007* (2013.01)

(58) Field of Classification Search
CPC .... G01R 15/181; H02H 1/0007; H01F 27/24; H01F 27/2823

USPC .......................................................... 324/127
See application file for complete search history.

(56) References Cited

U.S. PATENT DOCUMENTS

| | | | |
|---|---|---|---|
| 8,698,426 B1* | 4/2014 | Nguyen | H02H 1/06 315/177 |
| 2004/0130318 A1* | 7/2004 | Saltsov | G01D 5/204 324/207.17 |
| 2008/0297126 A1* | 12/2008 | Nagano | H01F 27/385 323/271 |
| 2012/0049839 A1* | 3/2012 | Kiendl | G01R 15/181 324/127 |
| 2012/0153931 A1* | 6/2012 | Liu | G01R 15/18 323/358 |
| 2012/0176120 A1* | 7/2012 | Jefferies | G01R 15/183 324/124 |
| 2013/0021705 A1* | 1/2013 | Sim | H02H 9/08 361/93.9 |
| 2013/0207638 A1* | 8/2013 | Gross | H01F 27/30 323/358 |

(Continued)

*Primary Examiner* — Patrick Assouad
*Assistant Examiner* — Demetrius R Pretlow
(74) *Attorney, Agent, or Firm* — Barnes & Thornburg LLP

(57) ABSTRACT

A combination current sensor is disclosed. The combination current sensor includes a self-powering current transformer (CT), comprising a CT core having a CT coil wound therearaound. The CT coil comprises a predetermined number of individual turns of a conductive wire wound progressively along a length of the CT core to define a winding density, wherein the winding density of the CT coil varies along the length of the CT coil core. The combination current sensor also includes a Rogowski current sensing transformer, which includes a Rogowski core and a Rogowski coil wound therearound.

17 Claims, 9 Drawing Sheets

(56) References Cited

U.S. PATENT DOCUMENTS

| | | | | |
|---|---|---|---|---|
| 2016/0055999 A1* | 2/2016 | Nanrudaiyan | ......... | H01H 33/08 |
| | | | | 361/102 |
| 2016/0111230 A1* | 4/2016 | Fonseca | ............... | H01H 9/0271 |
| | | | | 361/93.6 |
| 2018/0090267 A1* | 3/2018 | Du | .......................... | H01F 38/30 |
| 2018/0191091 A1* | 7/2018 | Kim | .................... | H01R 12/716 |
| 2018/0210023 A1* | 7/2018 | Rostron | ................. | G01R 15/06 |

* cited by examiner

CURRENT SENSOR AND METHOD OF ASSEMBLY

BACKGROUND

Embodiments of the invention relate generally to current sensors, and more specifically, to a device and method for assembling a combination current sensor.

DISCUSSION OF ART

Circuit Breakers and switching devices having an electronic tripping unit to protect an electrical circuit, using an iron-core current transformer (CT) and a Rogowski coil for each phase conductor, are well known. Typically, the iron-core CT supplies power to the electronic tripping unit, and the Rogowski coil provides an indication of the current in the phase conductor of the protected circuit.

Current transformers have a primary winding, a magnetic core and a secondary winding. An alternating current in the primary produces an alternating magnetic field in the core, which then induces an alternating current in the secondary that is proportional to the primary current over a wide range of currents. In a typical combination current sensor application, the CT primary is a phase conductor, and the CT secondary is a wound coil of N turns, and the secondary current is to provide power to the sensing circuitry.

A Rogowski coil is typically used for measuring alternating current (AC) such as a high-speed transient; pulsed currents or power frequency sinusoidal currents. The Rogowski coil is typically an evenly wound coil of N turns per unit length on a non-magnetic core of constant cross-sectional area. The winding wire is returned to the starting point along the central axis of the coil and the two ends are typically connected to a signal conditioning and processing circuit to receive the output signal from the Rogowski coil via a conductor such as a cable. The Rogowski coil is looped around the phase conductor carrying the current to be measured. The output voltage signal of the Rogowski coil is proportional to the time derivative of the current in the phase conductor contained in the Rogowski coil. This output voltage is used to detect and determine a profile of the current over time in the phase conductor in the electronic tripping unit.

The combination of an iron-core CT to provide power, and a Rogowski coil to provide current sensing, is typically referred to as a combination current sensor. Combination current sensors are generally used in low-voltage circuit-breakers with rated currents in the range of approximately 5 A to 6300 A and enable current measurement in the range from a few amperes to greater than 100 kA. Because typical circuit breakers are used to protect the circuit phase conductors, such as from dangerous overload conditions, it is important that the combination sensor provide a signal output that accurately reflects the current in the phase conductor.

The typical spacings and arrangement within such circuit breakers is often very limited and requires a relatively small or compact combination sensor typically having dual-bobbin or single-bobbin type CT coils for each phase of the circuit-breaker. Such size limitations can lead to using smaller gauge wire to form the CT coil which can cause undesirable higher temperature rises in the sensor and tripping unit.

Additionally, with known compact combination current sensors having dual-bobbin or single-bobbin type CT coils, maintaining linearity of the Rogowski coil output over the expected range of sensed currents is more difficult at both very low, and very high current levels due to the smaller size and close proximity of the CT and Rogowski coils to each other. In some instances, the phase current may be at a level that causes saturation of the CT coil, resulting in uneven magnetic flux around the CT, which in-turn couples into the Rogowski coil, with consequent adverse effects on the Rogowski coil output voltage signal, thereby reducing metering accuracy. For example, a phase current level that causes a saturation of the CT may cause nonlinear pole-to-pole interaction within the circuit breaker, and distort a sinusoidal output at the Rogowski coil output.

In some cases, increasing the distance or spacing, or using additional shield materials, between the Rogowski coil and CT coil can mitigate such issues. However, in device applications such as circuit breakers and tripping units, there is insufficient space available within the device to accommodate increased spacing.

Accordingly, what is needed is an improved combination sensor, where the Rogowski coil output signal is sinusoidal and more linear over a greater range of phase currents than conventional combination current sensors, and is more independent of the flux developed in CT operation, such as when the CT saturates.

It would also be desirable to have a combination sensor where the CT coil can be made using higher gauge wire to reduce the temperature rises over that of conventional combination current sensors.

BRIEF DESCRIPTION

A self-powered combination current sensor having concentric CT and Rogowski current sensors arranged to generate an output signal which accurately represents current in a power line. The CT provides self-powering functions while the Rogowski coil provides current sensing and allows high accuracy sensing over a wide range of currents.

In one embodiment, the combination current sensor includes a housing having a bus bar opening of substantially rectangular shape extending therethrough. The housing encloses a Rogowski current sensor coil and a CT coil. The housing may be constructed, e.g., molded, from electrically insulating material such as plastic. The housing may include a separate cover, or in some embodiments, the housing may be sealed with known potting materials, and the separate cover omitted.

A Rogowski current sensor core and coil are located in the housing and are positioned proximate a bus bar opening defined in the housing, so that the core and coil are substantially symmetric with respect to a center axis of the bus bar opening. The Rogowski core and coil in various embodiments may have a generally rectangular shape. In other embodiments, the Rogowski core and coil may have a generally elliptical shape. The Rogowski core may be segmented by equilateral bobbin winding segments, or legs.

For example, in an embodiment, the Rogowski current sensor core is formed of four bobbins, each having respective first and second ends, coupled to a respective first or second end of an adjacent leg, and has a substantially rectangular cross-sectional shape. Each bobbin also has a first and second flanges, each including an interlocking member which facilitates both magnetic coupling and arrangement of the bobbins in a substantially rectangular or elliptical configuration to form the Rogowski current sensor core. The bobbins are constructed of an electrically insulating material, such as plastic, with a permeability substantially equal to that of air. This Rogowski current sensor coil is formed by windings wrapped around the bobbins of the Rogowski current sensor core.

The Rogowski current sensor core and coil construction permits a symmetrical sensor coil to be formed without requiring a toroidally wound core.

The combination current sensor also includes a self-powering current transformer (CT) core and coil positioned substantially symmetrically with respect to the center axis of the bus bar opening. The CT core and coil in various embodiments may have a generally rectangular shape. In other embodiments, the CT core and coil may have a generally elliptical shape. The CT core is formed, in one embodiment, of a plurality of iron laminations in a conventional manner. The CT core is insulated from the CT coil by electrically insulating material, such as plastic. The CT coil is formed by windings wrapped on the CT core. In an embodiment, the self-powering CT core and coil is a symmetrical design for improved performance.

The CT core defines a first leg, a second leg, a third leg and a fourth leg, cooperatively defining a gap therebetween. The first leg is coupled to the second leg to define a first corner portion therebetween, the second leg is further coupled to the third leg to define a second corner therebetween, the third leg is further coupled to the fourth leg to define a third corner therebetween, the fourth leg further coupled to the first leg to define a fourth corner therebetween, such that the first leg faces the third leg and the second leg faces the fourth leg. In various embodiments, each of the legs may be substantially straight and define a respective longitudinal axis therethrough. Each of the corner portions may be curvilinear. In some embodiments, any two opposing legs may be curvilinear.

In an embodiment, the number of turns per unit length of the CT coil is varied along the length of the CT core. For example, in an embodiment, the number of turns per unit length of the CT coil is varied based on the location of the respective turns on the CT core. In other embodiments, the number of CT coil turns per unit length at a given location on the CT core is further determined based on a ratio of the number of turns per unit length wound at another location on the core. For example, in an embodiment, the number of turns of the CT coil is greater per unit length along the corner portions of the CT core than along the legs. In other embodiments, each respective leg of the core may comprise two contiguous leg portions, wherein the number of turns per unit length along one of the respective leg portions is different than the number of turns per unit length along the remaining leg portion. In other embodiments, the number of CT coil turns per unit length along each corner portion of the CT coil core is greater than the number of turns per unit length along each of the respective leg portions, and the number of turns per unit length along each one of the respective leg portions is different than the number of turns per unit length along the respective remaining contiguous leg portion.

To monitor current in a power line, the power line is electrically coupled to a bus bar positioned so that it extends through the current sensor bus bar opening. When the current sensor and bus bar are assembled as described above, the Rogowski current sensor core and coil and the self-powered CT core and coil are substantially symmetrical with respect to the bus bar. This symmetry can provide superior accuracy compared to unsymmetrical coils.

In operation, the magnetic field generated by current in the bus bar induces a voltage in the Rogowski current sensor coil and a current in the self-power CT coil. The induced voltage in the Rogowski current sensor coil is proportional to the time rate of change of the current in the power conductor, and is provided to a sensing circuit which generates an output signal used for controlling the power system. The induced current in the CT coil is used to energize the sensing circuit components as well as any additional components of the breaker unit, such as, for example, a power rectifier and control circuit which, in turn, may be connected to supply power to other components of the unit.

DRAWINGS

The present invention will be better understood from reading the following description of non-limiting embodiments, with reference to the attached drawings, herein below:

DETAILED DESCRIPTION

Figure 1:
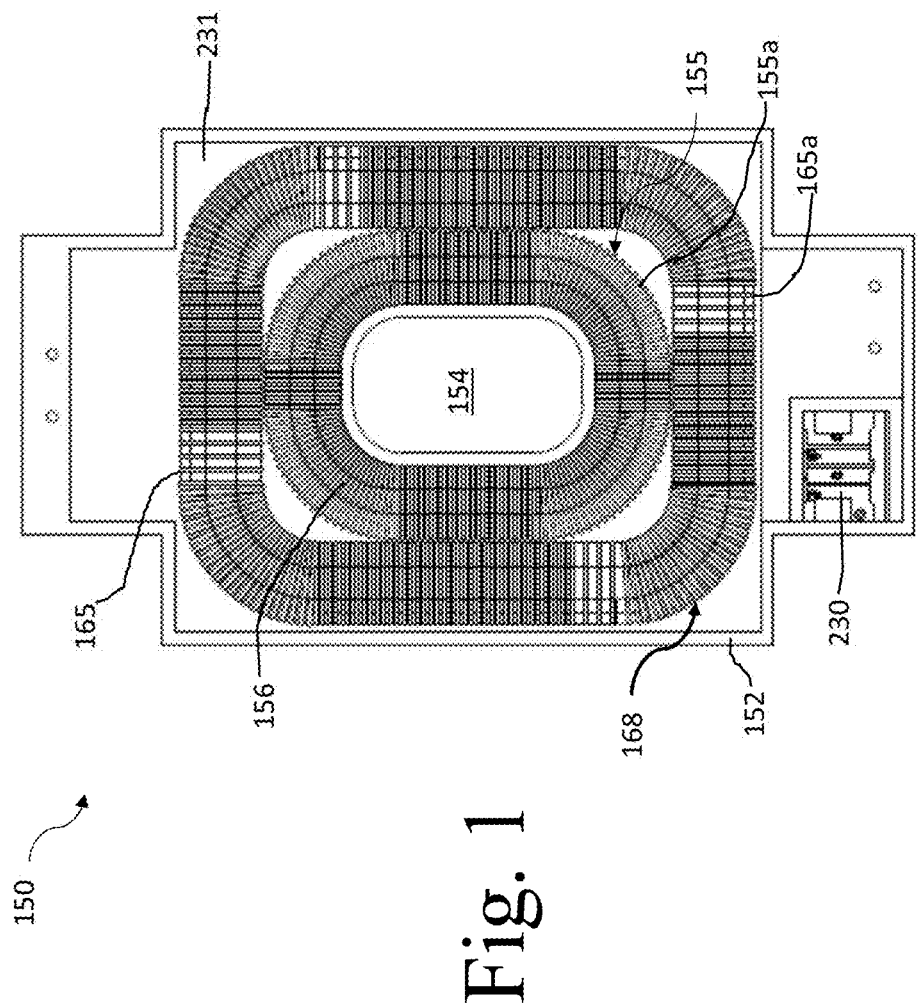
FIG. 1 is an top view of a combination current sensor, with cover removed for clarity, in accordance with an embodiment.

Reference will be made below in detail to exemplary embodiments of the invention, examples of which are illustrated in the accompanying drawings. Wherever possible, the same reference characters used throughout the drawings refer to the same or like parts, without duplicative description.

As used herein, the terms "substantially," "generally," and "about" indicate conditions within reasonably achievable manufacturing and assembly tolerances, relative to ideal desired conditions suitable for achieving the functional purpose of a component or assembly. As used herein, "coupled," and "connected," mean that the referenced elements are directly or indirectly connected and intervening components may be present.

Additionally, while the embodiments disclosed herein are primarily described with respect to circuit breakers, e.g., circuit breakers with electronic tripping units, for circuit protection from overload currents, it is to be understood that embodiments of the present invention may be applicable to other apparatus and/or methods that benefits from the teachings herein.

Figure 2:
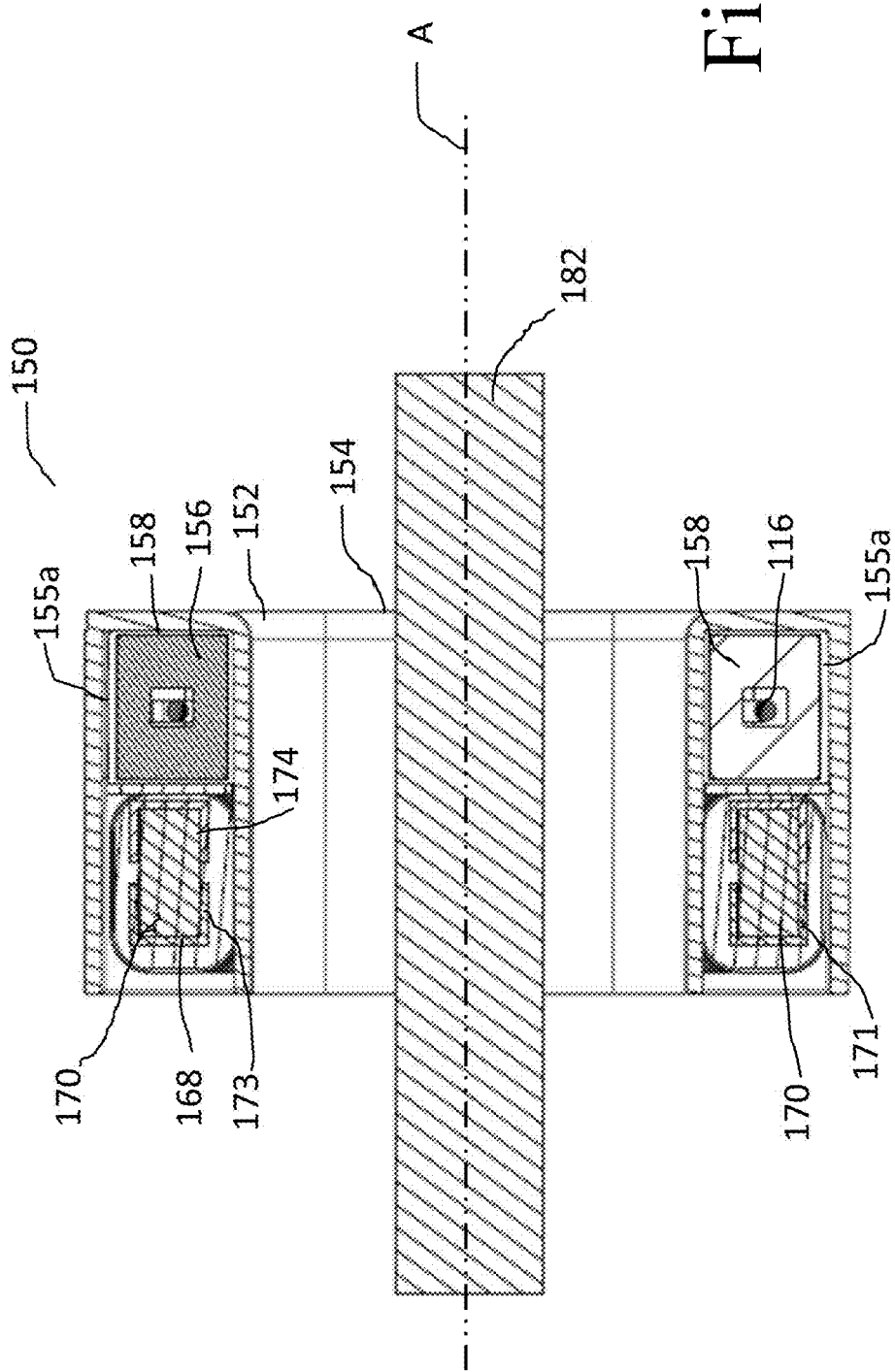
FIG. 2 is a cross-section view of a combination current sensor, in accordance with alternative embodiment.

Referring now to FIGS. 1 and 2, a self-powered current sensor 150 in accordance with various embodiments of the present invention is shown. Current sensor 150 includes a housing 152 having a bus bar opening 154 extending therethrough. Bus bar opening 154 is substantially rectangular shaped and sized to receive a phase conductor 182 therethrough. Housing 152 is constructed, e.g., molded, from electrically insulating material such as plastic. As shown in FIG. 1, with housing cover removed for clarity, a Rogowski coil 155 and a CT coil 165 may be concentrically arranged within housing 152.

A Rogowski current sensor core 156 is positioned proximate bus bar opening 154 and is symmetric about a center axis "A" passing longitudinally through opening 154. The Rogowski current sensor core 156 may comprise any conventional air-core bobbin that enables the combination sensor 150 to function as described herein. For example, the Rogowski current sensor core 156 may be formed of four bobbins 158, each having a first end 161 and a second end 162, and each having a substantially rectangular cross-sectional shape. The bobbins 158 are constructed from an electrically insulating material such as plastic.

The Rogowski current sensor coil 156 is formed on the bobbins 158 by progressively wrapping a predetermined number of winding turns 155a of conductive wire, for example copper wire, around the current sensor core 156, in a conventional manner. In an embodiment, the Rogowski current sensor core 156 and coil are mounted on an insulative substrate 231, such as a printed circuit board. The printed circuit board 231 may include terminations (not shown) for coupling the Rogowski and CT coil ends (not shown) via a connector 230 to a current sensing circuit (not shown).

Figure 8:
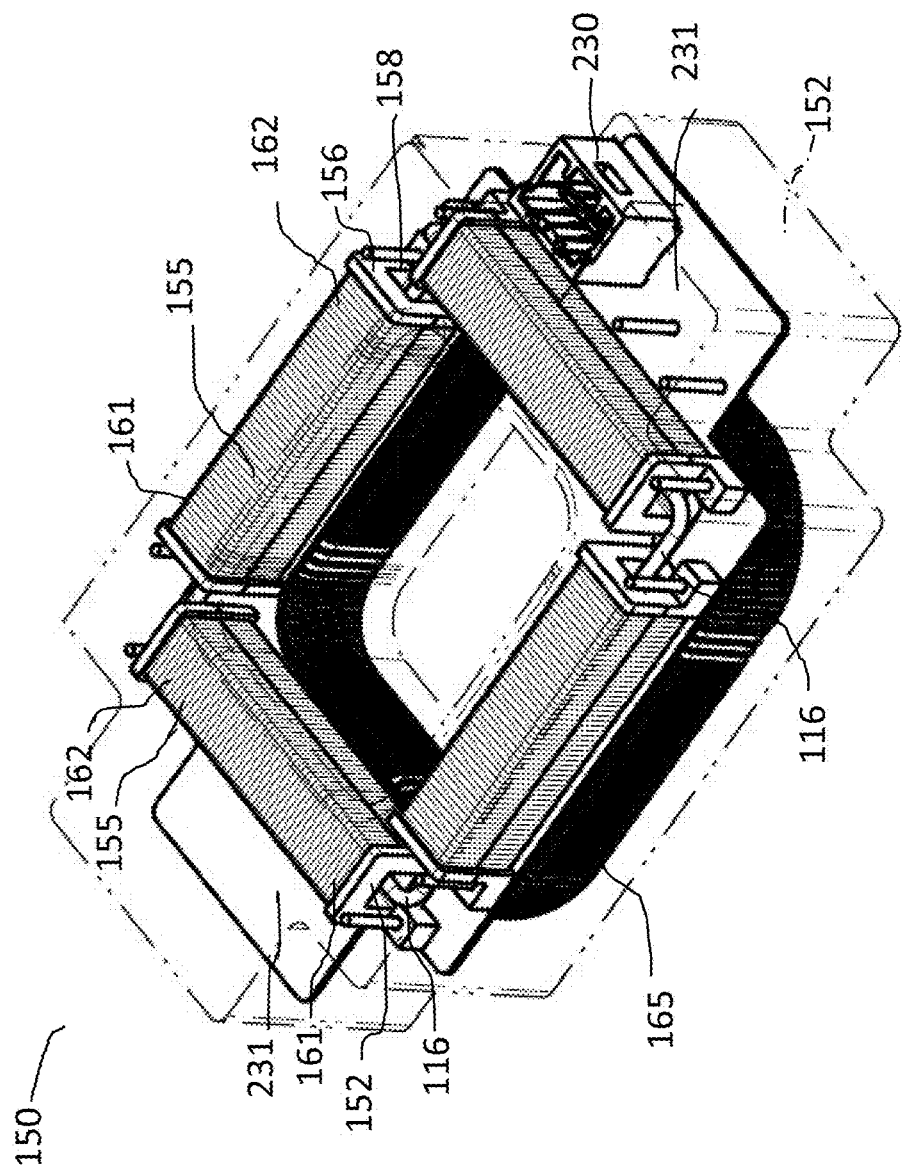
FIG. 8 is perspective view of a combination current sensor according to an embodiment, with housing depicted in phantom for clarity.
Figure 9:
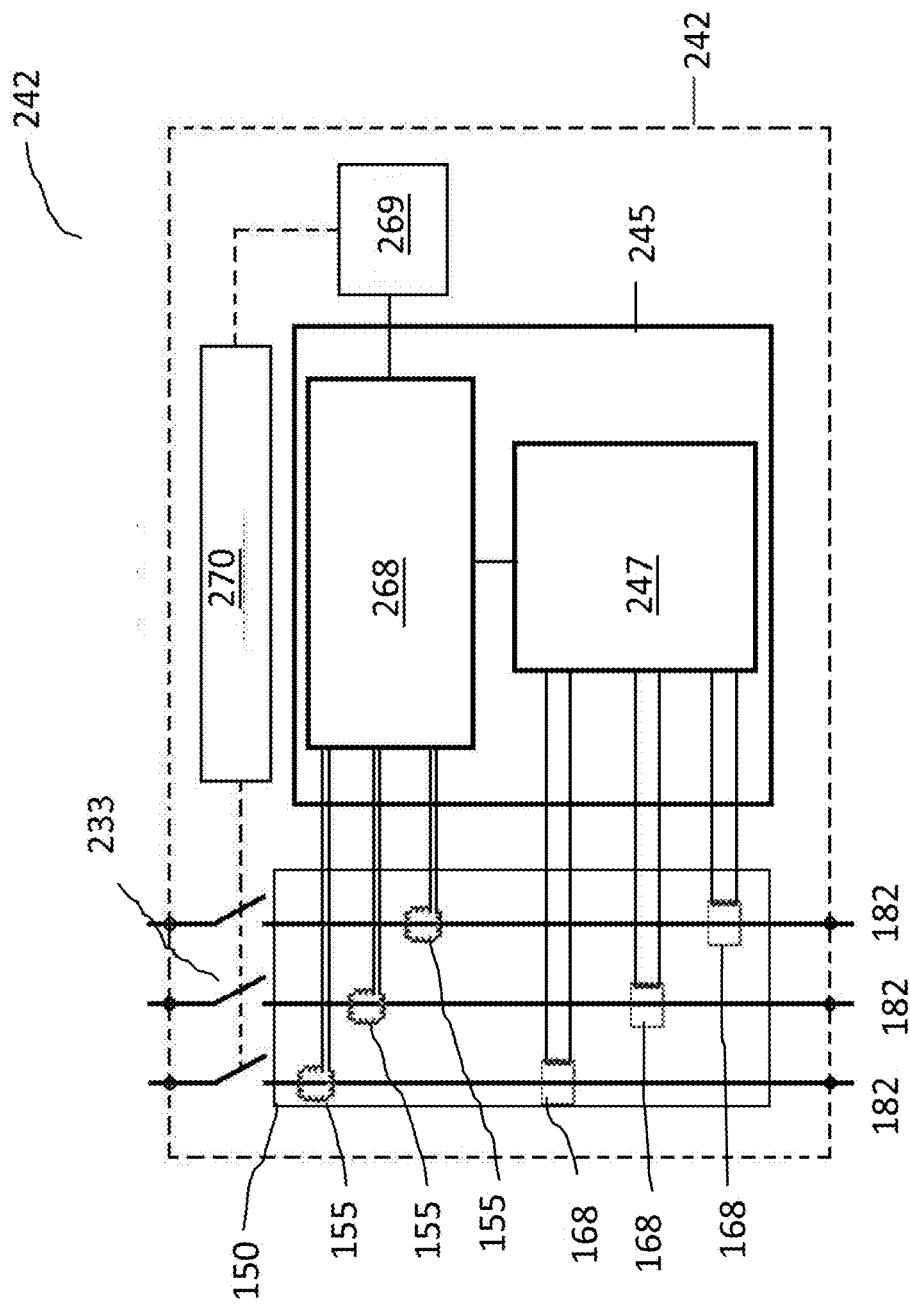
FIG. 9 is schematic diagram of a circuit breaker employing a combination current sensor in accordance with an embodiment.

With reference to the combination current sensor 150 depicted in FIG. 8, a main Rogowski current sensing winding, or coil, 155 is wound in a clockwise direction around core 156. A compensating turn winding 116 may be placed inside the core 156 and extends the longitudinal length of each bobbin 158. Main current sensing winding 155 is wound over compensating turn winding 116. In the embodiment depicted in FIG. 8, four (4) wound current sensor coil bobbins 158 are arranged to form rectangular current sensing core 156. It will be appreciated that in other embodiments, the Rogowski coil 155 may be arranged in any convenient shape that enables the current sensor 150 to function as described herein. For example, in embodiments, the Rogowski coil 155 may alternatively comprise a round shape, or an elliptical shape. The main current sensing windings 155 on each bobbin 158 are electrically connected in a series arrangement. Compensating turn windings 116 of each bobbin also are electrically connected in a series arrangement. Leads (not shown) extend from sensing core 158 and are coupled to a connector 230 on circuit board 231 for electrical connection, for example, to an analog to digital converter (not shown) of a digital integrator circuit.

FIG. 2 depicts a cross-sectional view of an embodiment of a combination current sensor 150. A phase conductor such as bus bar 182 is shown extending through opening 154 for illustrative purposes. Rogowski current sensing windings 155a are shown wound around current sensing bobbins 158, and the CT windings 165a are shown wound around magnetic CT core 170. In an embodiment, the magnetic CT core 170 comprises steel laminations (not shown).

Current sensor 150 also includes a self-powered current transformer (CT) core 168 positioned substantially symmetrically with respect to the center axis of opening 154. The CT core 168 generally comprises a magnetic core 170 having an insulative covering 171. In various embodiments, the CT core 168 has a substantially rectangular shape, while in other embodiments the CT core 168 may have a substantially elliptical shape. In an embodiment, the magnetic core 170 is formed from separate magnetic c-cores (not shown) which may be welded or otherwise held together by a variety of known techniques, such as using aluminum or other non-magnetic material straps (not shown). The magnetic core 170 may be, for example, formed by stacking a plurality of iron laminations (not shown). It should be appreciated that the magnetic core 170 may also be formed using other conventional methods without departing from the spirit and scope of the embodiments described herein.

Figure 5:
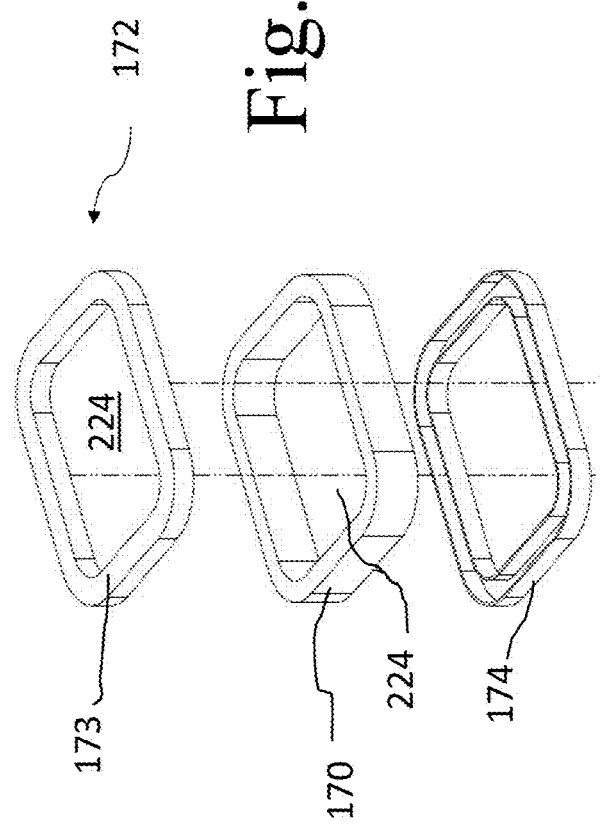
FIG. 5 is an exploded view of a rectangular magnetic CT core in accordance with an embodiment, with coil windings omitted for clarity.

The stacked iron laminations (not shown) are magnetic, and are enclosed by an insulative covering 171 such as for example, a housing or mating end caps. In certain embodiments, as depicted in FIG. 5, the covering 171 may comprise an upper housing element 173 and a lower housing element 174, that cooperatively enclose the magnetic core 170, and define an opening or gap 224 therethrough, arranged to be substantially symmetrically disposed with respect to the center axis of opening 154. In other embodiments, the stacked laminations (not shown) may extend through longitudinal bores (not shown) defined in a plurality of CT bobbins arranged to cooperatively form the insulative cover 171 to enclose the laminations in a conventional manner. In various embodiments, the CT core housing 171 is formed from electrically insulating material such as plastic.

Figure 6:
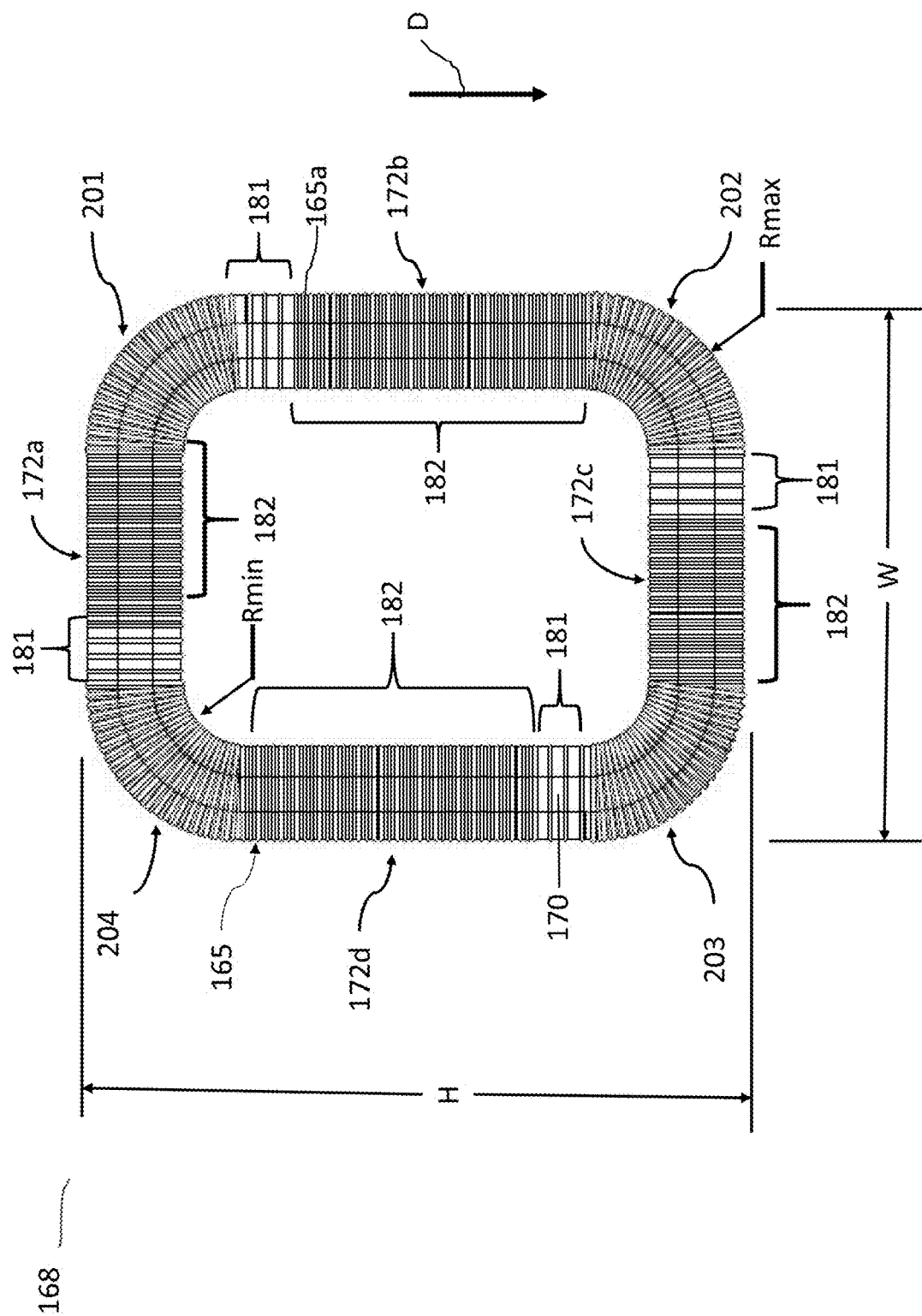
FIG. 6 is top view of the magnetic core of FIG. 5 with a first layer of coil windings added.
Figure 7:
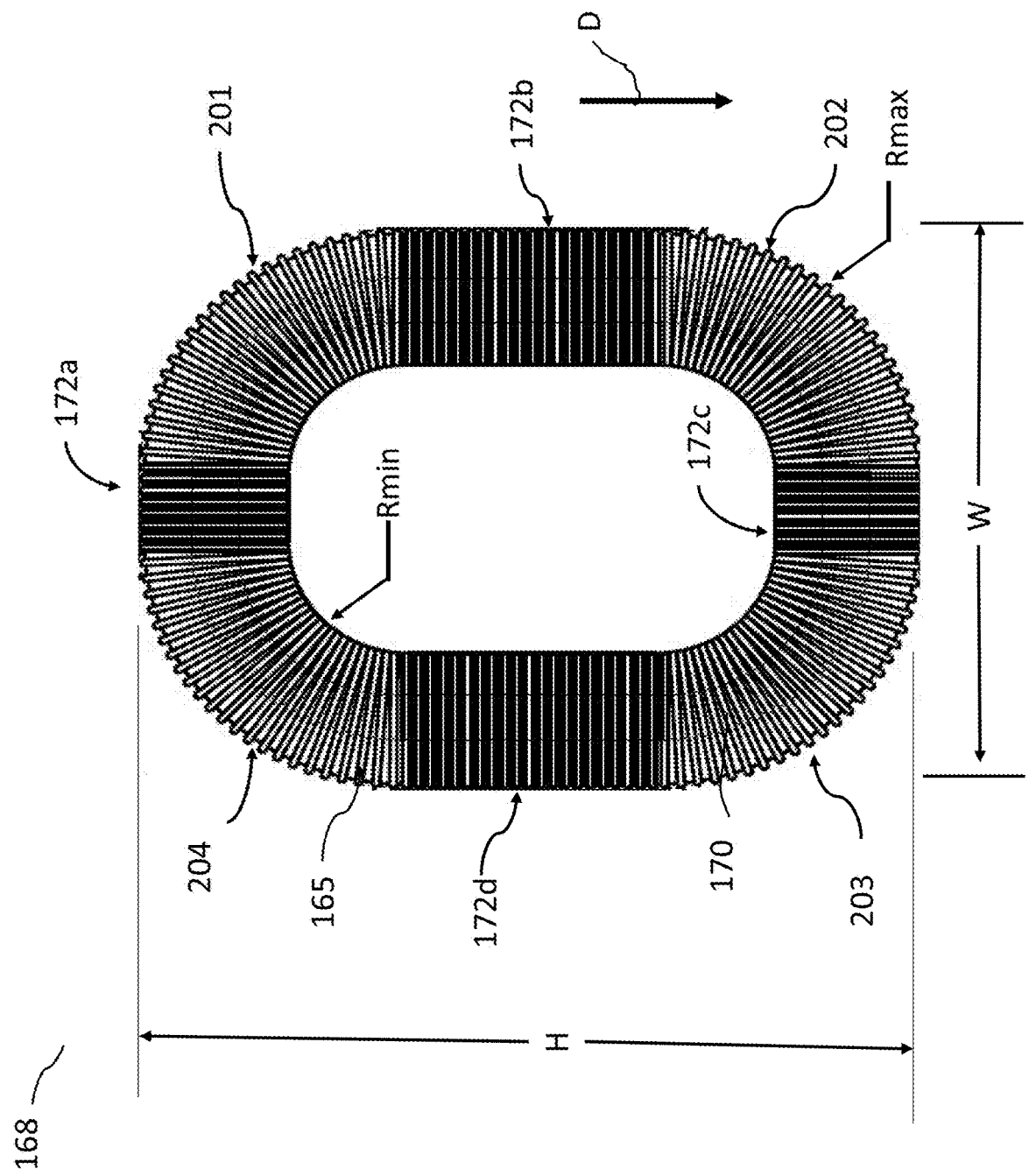
FIG. 7 is top view of an elliptical magnetic CT coil, in accordance with another embodiment.

With reference to FIGS. 5 and 6, in an embodiment, the CT core 168, comprising the magnetic core 170 and insulative covering 171, defines a first leg 172a, a second leg 172b, a third leg 172c, and a fourth leg 172d, cooperatively defining gap 224 therebetween. The first leg 172a is coupled to the second leg 172b to define a first corner portion 201 therebetween, the second leg 172b is further coupled to the third leg 172c to define a second corner 202 therebetween, the third leg 172c is further coupled to the fourth leg 172d to define a third corner 203 therebetween, the fourth leg 172d is further coupled to the first leg 172a to define a fourth corner therebetween 204, such that the first leg 172a faces the third leg 172c and the second leg 172b faces the fourth leg 172d. As can be seen, two opposing legs 172b, 172d of the CT core define an overall height "H" of the core, and the remaining opposing legs 172a, 172c of the CT core define an overall width, "W". Additionally, corner portions 201, 202, 203, 204 may be curvelinear and may be defined based on an inner radius "Rmin". In other embodiments, the corner portions 201-204 may be defined based an outer radius "Rmax". The CT coil 165 is formed by progressively wrapping or winding turns 165a of a conductive wire around the legs 172a-d and corners 201-204 of core 168, proceeding in a desired direction "D", for example a clockwise direction along the core 168.

The CT coil 165 is formed based on a predetermined number of individual turns 165a of a conductive wire, for example copper wire, wrapped around the length of the CT core legs 172a-d and corners 201-204. In an embodiment, the turns 165a are made transverse to the longitudinal axis (not shown) defined through each leg 172a-d. The individual turns 165a or windings are wound progressively along the length of the CT core legs 172a-d and corners 201-204 to cooperatively define the coil 165. The winding turns 165a are continuous and define a number of winding turns 165a per unit length of the CT coil 165. The number of individual winding turns 165a per unit length, otherwise known as the turns density, varies along the length of the CT coil core 170. The CT coil winding turns density over a respective portion of the CT core 170 is dependent upon the relative location of the respective portion on the CT core 170. In various embodiments, the CT coil windings 165a are wound over substantially an entire length of the CT core 170.

Additionally, in various embodiments, the turns density or number of individual winding turns 165a per unit length of the CT core 170 will be greater in certain predetermined portions of the CT core 170 than in other portions. In some embodiments, the number of winding turns 165a of the CT coil 170 is greater per unit length along a corner portion 201-204 than along a leg portion 172a-d. In other embodiments, one or more of the legs 172a-d of the CT core 170 may define a respective first portion 181 and a respective second portion 182, and the number of winding turns 165a of the CT coil along each respective first portion 181 is different than the number of winding turns 165a along each respective second portion 182. For example, the number of winding turns 165a along each respective first portion 181 may be less than the number of winding turns 165a along each respective second portion 182.

In various embodiments, the pitch of the winding turns 165a may be kept constant, or may be varied as desired to obtain the desired number of winding turns 165a along the various portions of the CT core 168. Additionally, in various embodiments, the winding turns 165a may be wound to define a plurality of layers (not shown) of winding turns 165a. Any desired number of layers of winding turns 165a may be used to form the CT coil 168.

For example, in an embodiment, the winding density of CT winding turns 165a along the leg 172a-d of the CT magnetic core 170 is approximately 90% of the winding density of the CT winding turns 165a along the corners 201-204 of the CT magnetic core 170. In other words, in such an embodiment, there are 10% more turns 165a in the corners 201-204 than in the legs 172a-d. In other embodiments, the winding density in the corners 201-204 is greater than that along the legs 172a-d, within in a predetermined range of between 5% and 20%.

In various embodiments, the CT winding density in the respective second portion 182 of each leg 172a-d of the CT magnetic core 170 is greater by a predetermined ratio that may be in a range from 0.8 to 2.2 than the winding density in the corners 201-204 CT magnetic core 170.

In yet another embodiment, the number of CT winding turns 165a per unit length along the respective first portion 181 of each leg 172a-d of the CT magnetic core 170 is in a range of between 70%-90% of the number of winding turns 165a per unit length in the respective second portion 182 of each respective leg 172a-d. In certain embodiments, a minimum ratio of turns along the legs to the turns along the corners may be determined by: Minimum turns ratio=((1.1 times the inner radius at corner)/(inner radius at corner))*(inner perimeter of CT core/wire diameter). In certain other embodiments, a maximum ratio of turns on the legs to the turns along the corners may be calculated by: Maximum turns ratio=((Outer radius at corner)/(inner radius at corner))*(inner perimeter of core/wire diameter).

Accordingly, in some embodiments, where the winding density over a portion of the CT core is determined based upon the location of the respective portion on the CT core the winding density along each corner portion of the core may exceed the winding density in each second portion of each leg by a ratio in the range of 1.05 to 2.1. In other embodiments, the winding density along a first portion 181 of each respective leg may be less than the winding density the respective second portion of each leg 182 by a ratio in the range of 0.5 to 0.99.

By way of a non-limiting example, and for illustrative purposes only, the following example of a specific CT core winding in keeping with an embodiment is provided. With reference to FIG. 6, an exemplary embodiment of a CT coil having 376 total winding turns/layer, an overall CT core 168 height "H" of 44 mm, a CT core 168 width "W" of 37 mm, an inner radius "Rmin" of 6 mm formed at each corner 201-204, an outer radius "Rmax" of 10 mm at each corner, an inner perimeter "Pmin" of the core 168 of 117 mm, a winding wire diameter of 0.25 mm, and a turn pitch of 0.344 mm, the following structure for the CT core may be configured: first and third legs 172a, 172c, each having a length of 16 mm, and each comprising a first portion 181 having a length of 8 mm, and each comprising a second portion 182 having a length of 8 mm; the second and fourth legs 172b, 172d, each having a length of 24 mm, and each comprising a first portion 181 having a length of 16 mm, and a second portion 182 having a length of 8 mm. The coil 165 may be wound, for example, beginning at the first portion 181 of the second leg 172b of the core 170, and proceeding to form the coil 165 by wrapping turns 165a of copper wire around the core 170. While progressing continuously around the core 170 in a clockwise direction "D", as indicated by the arrow in FIG. 6, the coil 165 is formed by completing 45 winding turns along the first portion 181 of the second leg 172b, thence completing 30 turns along second corner 202, thence 21 turns along the first portion 181 of third side 172c, thence completing 23 turns along the second portion 182 of third side 172c, thence completing 30 turns along third corner 203, thence completing 21 turns along the first portion 181 of the fourth side 172d, thence 45 turns along the second portion 182 of the fourth side 172d, thence completing 30 turns along fourth corner 204, thence 21 turns along the first portion 181 of first side 172a, thence completing 23 turns along the second portion 181 of first side 172a, thence 30 turns along first corner 201, thence completing 21 turns along the first portion 181 of the second side 172b. A similar process would repeat for any subsequent layers as necessary.

The CT coil 165 may be fabricated using a single conductor, or in other embodiments two wires in parallel may be wound in tandem to form the CT coil. In other embodiments, any number of wires, such as 3 or 4 for example, in parallel may be used to form the CT.

When arranging a relatively small combination current sensor having a substantially rectangular or elliptical shape, that comprises a Rogowski current sensing coil and a CT power coil, several technical advantages are obtained by varying the winding density along the length of the CT coil in accordance with various embodiments. It has been shown through testing that varying the coil density along the full length of a rectangular or elliptical CT in a combination sensor, provides better performance, and uses less wire than known single-bobbin or dual-bobbin CT coil designs.

Figure 3:
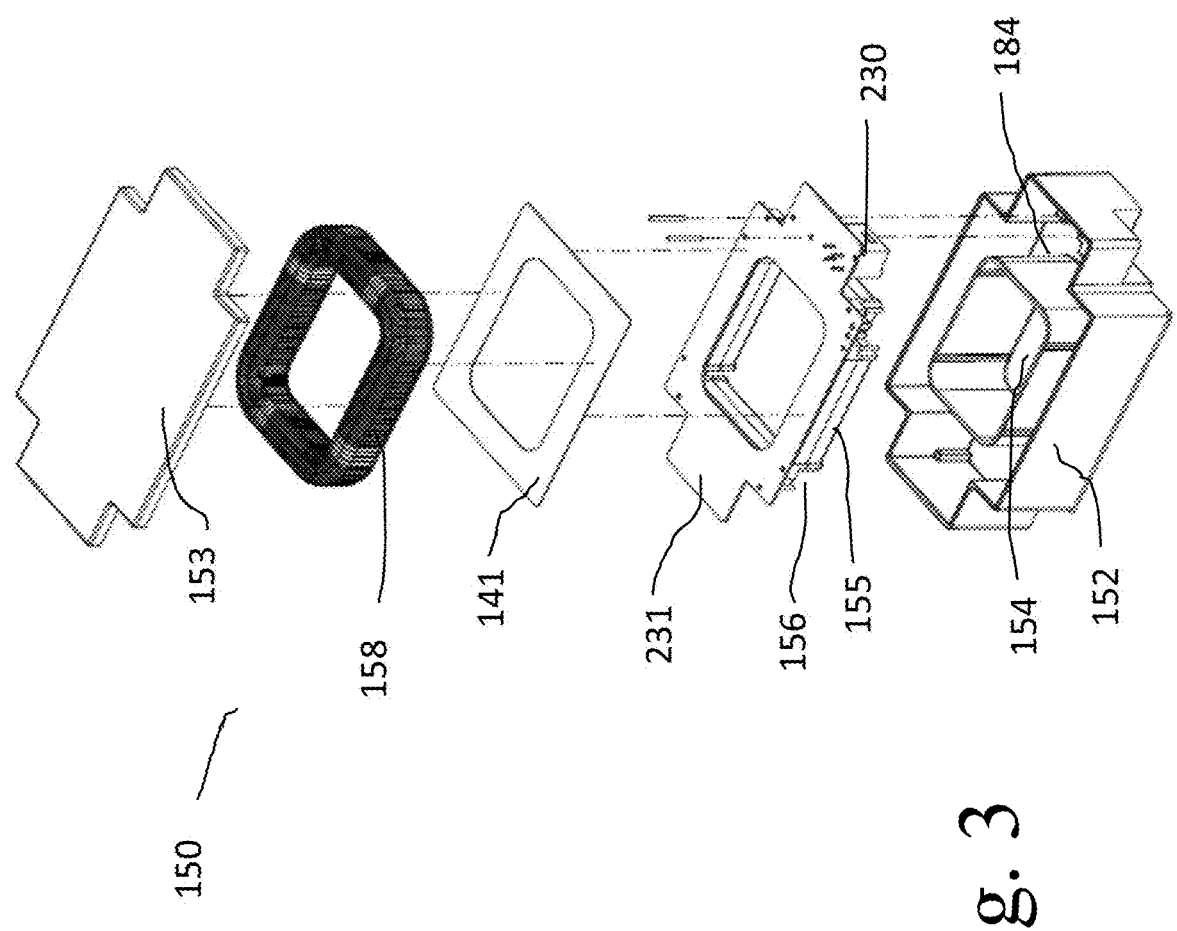
FIG. 3 is an exploded view of a combination current sensor, in accordance with the embodiment of FIG. 2.

FIG. 3 is an exploded view of combination current sensor 150 with some parts omitted for clarity. Sensor 150 includes a housing 152 having a substantially rectangular cross-section, comprising a base 184. The current sensing core 156 is may be equal to or smaller in diameter than CT core 158. After mounting the Rogowski current sensor 155 to the substrate 231, it is inserted into the housing 152 with substrate 231 arranged outwardly to thereby separate the Rogowski coil 155 from the CT coil 165. As shown in FIG. 3, current sensing coil 155 is electrically separated from CT coil 165. Such separation between CT coil 165 and Rogowski current sensing coil 155 facilitates electrical isolation between CT coil 165 and Rogowski current sensing coil 155. An additional insulator 141, such as a mylar sheet may be placed on the substrate to provide additional electrical insulation. The CT coil 165 is easily assembled into housing 152 by placing the coil 165 into the housing 152 on the insulator 141 or substrate 231. A cover 153 may be engaged to housing 152 with an opening aligned with opening 154. Optionally, housing 152 may be potted with a suitable epoxy or silicon compound (not shown). In such embodiments, the potting material (not shown) may be further arranged in lieu of the cover 153.

Figure 4:
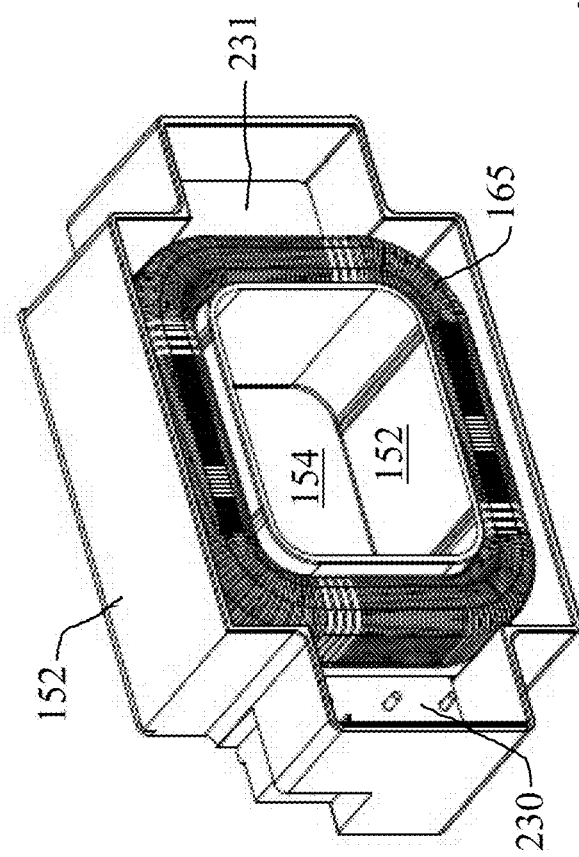
FIG. 4 is a perspective view of the embodiment of FIG. 3, in assembled form, with cover and potting material omitted for clarity.

FIG. 4 illustrates housing base 184 having Rogowski current sensing coil 155 and CT coil 165 positioned therein. Also, Rogowski current sensing coil 155 and power CT coil 165 are substantially symmetrical with respect to bus bar opening 154. The CT core (not shown) and Rogowski current sensing core (not shown) are completely enclosed within housing 152. Bus bar opening 154, extends through sensor 150.

To monitor current in a power line, the power line is electrically coupled to a bus bar 182 positioned to extend through bus bar opening 154 in current sensor 150 so that Rogowski current sensor core 156 and coil 155, and CT core 168 and coil 165, are substantially symmetrical with respect to the bus bar.

The magnetic field generated by current in the bus bar 182 induces a voltage in current sensor coil 155 and also induces a current in CT coil 165. The induced voltage in current sensor coil 165 is proportional to the time rate of change of the current in the power conductor and is provided to a sensing circuit which generates an output signal used for controlling the power system.

The induced current in CT coil 180 is used to energize the sensing circuit components. For example, power coil 180 may be electrically connected to a power rectifier and control circuit which, in turn, may be connected to supply power via connector to other components of the unit.

In current sensor 150, the sensing and self-powering functions are separated to facilitate high accuracy current sensing at a low cost. Rogowski core 156, i.e., an air core, can provide increased accuracy, dynamic range, linearity, and frequency response. In addition, self-power core 168 is a low cost, saturable, core which prevents overcurrent generation and enables low power consumption by the breaker unit.

Since current sensing core 156 is symmetric with respect to bus bar 182, accuracy of sensor 150 is enhanced. Self-power core 168 does not necessarily have to be symmetric about bus bar 182 to provide the magnetic shielding as described above. The geometric shape of the Rogowski sensing core, of course, is not limited to the rectangular shape described in connection with sensor 150 in order to be symmetrical with the bus bar since it may be, for example, rectangular, polygonal, elliptical, or circular In certain embodiments, the combination current sensor 150 may additionally comprise a circuit breaker 242 which includes a housing and an electronic tripping unit 245. The combination current sensor 150 may be used both to detect the current in the phase conductors 182 of and to supply the electronic module 247 of the circuit breaker tripping unit 245 with energy. Electronic module 245 may additionally include signal conditioning circuitry and microprocessor elements 268. For example, for a typical 3-pole circuit breaker protecting a 3-phase electrical circuit, three combination current sensors 150 may be installed within the circuit breaker housing. Each combination current sensor 150 will include the Rogowski coil 155 for measuring current, and the iron-cored current transformer 168 for supplying energy to the electronic module 247. The Rogowski coil provides, as an output signal, a voltage that is proportional to the time change in the current in the respective conductor 182 contained in the Rogowski coil 155. The temporal profile and the root-mean-square value of the current in the conductor 182 are determined from this voltage signal in the electronic trip unit 245 using analog signal processing and a downstream microcontroller with an analog/digital converter 268. If the temporal profile of the current or the root mean-square value exceeds a defined threshold value for a predetermined period of time, a tripping mechanism 270 is driven by the tripping unit 245 and the switching contacts 233 are opened thereby.

The above described current sensors can be used in various applications, such as circuit breaker applications. The current sensors can provide an accurate signal representative of current in a power conductor, and require relatively low material and assembly costs. Further, the current sensors are small and readily adapted for existing applications.

While only certain preferred features of the invention have been illustrated and described, many modifications and changes will occur to those skilled in the art. It is, therefore, to be understood that the appended claims are intended to cover all such modifications and changes as fall within the true spirit of the invention.

While the dimensions and types of materials described herein are intended to define the parameters of the invention, they are by no means limiting and are exemplary embodiments. Many other embodiments will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, terms such as "first," "second," "third," "upper," "lower," "above," "below," etc. are used merely as labels, and are not intended to impose numerical or positional requirements on their objects. Further, the limitations of the following claims are not written in means-plus-function format and are not intended to be interpreted as such, unless and until such claim limitations expressly use the phrase "means for" followed by a statement of function void of further structure.

This written description uses examples to disclose several embodiments of the invention, including the best mode, and to enable one of ordinary skill in the art to practice the embodiments of invention, including making and using any devices or systems and performing any incorporated methods. The patentable scope of the invention is defined by the claims, and may include other examples that occur to one of ordinary skill in the art. Such other examples are intended to be within the scope of the claims if they have structural elements that do not differ from the literal language of the claims, or if they include equivalent structural elements with insubstantial differences from the literal languages of the claims As used herein, an element or step recited in the singular and proceeded with the word "a" or "an" should be understood as not excluding plural of said elements or steps, unless such exclusion is explicitly stated. Furthermore, references to "one embodiment" of the present invention are not intended to be interpreted as excluding the existence of additional embodiments that also incorporate the recited features. Moreover, unless explicitly stated to the contrary, embodiments "comprising," "including," or "having" an element or a plurality of elements having a particular property may include additional such elements not having that property.

Since certain changes may be made in the above-described invention, without departing from the spirit and scope of the invention herein involved, it is intended that all of the subject matter of the above description shown in the accompanying drawings shall be interpreted merely as examples illustrating the inventive concept herein and shall not be construed as limiting the invention.

What is claimed is:

1. A combination current sensor comprising:
   a self-powering current transformer (CT) comprising a CT core having a CT coil wound therearaound, the CT coil comprising a predetermined number of individual turns of a conductive wire wound progressively along a length of the CT core to define a number of winding turns, the CT coil defining a winding density that varies along the length of the CT core; and
   a Rogowski current sensing transformer comprising a Rogowski core and a Rogowski coil wound therearound;
   wherein the CT and the Rogowski current sensing transformer are concentrically arranged.

2. The combination current sensor of claim 1, further comprising:
   a housing defining a conductor opening extending therethrough, the conductor opening defining a central axis therethrough,
   wherein the CT coil and Rogowski coil are disposed within the housing, and arranged symmetrically with respect to the central axis of the conductor opening.

3. The combination current sensor of claim 1, wherein:
   the CT defines a first opening therethrough;
   the Rogowski current sensing transformer defines a second opening therethrough; and
   the first and second openings are aligned.

4. The combination current sensor of claim 1, wherein the CT coil comprises a shape that is one of rectangular and elliptical.

5. The combination current sensor of claim 1, wherein the winding density over a portion of the CT core is determined based upon a location of a respective portion on the CT core.

6. The combination current sensor of claim 1, wherein the CT core comprises a first leg, a second leg, a third leg, and a fourth leg cooperatively defining a first gap therebetween, and wherein the first leg is coupled to the second leg to define a first corner portion therebetween, the second leg is further coupled to the third leg to define a second corner portion therebetween, the third leg is further coupled to the fourth leg to define a third corner portion therebetween, and the fourth leg is further coupled to the first leg to define a fourth corner portion therebetween, such that first leg faces the third leg and the second leg faces the fourth leg.

7. The combination current sensor of claim 6, wherein the winding density of the CT coil is greater per unit length along the first, second, third, and fourth corner portions than along the first, second, third, and fourth legs.

8. The combination current sensor of claim 1, wherein each leg of the CT core defines a respective first portion and a respective second portion, and wherein the winding density of the CT coil along the respective first portion of each leg is different than the winding density of the CT coil along the respective second portion of each leg.

9. The combination current sensor of claim 8, wherein the winding density of the CT coil along each respective first portion of each leg is less than the winding density of the CT coil along each respective second portion of each leg.

10. The combination current sensor of claim 6, wherein the winding density of the CT coil along each corner portion of the core exceeds the winding density of the CT coil along each leg by a ratio in the range of 1.05 to 2.1.

11. The combination current sensor of claim 8, wherein the winding density of the CT coil along each corner portion of the core exceeds the winding density of the CT coil along each leg by a ratio in the range of 0.8 to 2.1.

12. The combination current sensor of claim 9, wherein the winding density of the CT coil along each respective first portion of each leg is less than the winding density of the CT coil along each respective second portion of each leg by a ratio in the range of 0.5 to 0.99.

13. The combination current sensor of claim 9, wherein the winding density of the CT coil along each respective first portion of each leg is less than the winding density of the CT coil along each respective second portion of each leg by a ratio in the range of 0.8 to 1.2.

14. The combination current sensor of claim 1, wherein the Rogowski coil comprises four bobbins collectively arranged in a shape that is one of rectangular and elliptical.

15. The combination current sensor of claim 1, wherein the CT coil comprises a shape that is one of rectangular and elliptical, and wherein the Rogowski coil comprises a shape that is one of rectangular, round, and elliptical.

16. A circuit breaker comprising:
   an electronic trip unit in signal communication with a tripping mechanism; and
   a combination current sensor comprising:
      a self-powering current transformer (CT), defining a first opening therethrough, comprising a CT core having a CT coil wound therearound;
         wherein the CT core comprises a first leg, a second leg, a third leg, and a fourth leg cooperatively defining a first gap therebetween, wherein the first leg is coupled to the second leg to define a first corner portion therebetween, the second leg is further coupled to the third leg to define a second portion corner therebetween, the third leg is further coupled to the fourth leg to define a third portion corner therebetween, the fourth leg is further coupled to the first leg to define a fourth corner portion therebetween, such that first leg faces the third leg and the second leg faces the fourth leg; and
         wherein the CT coil comprises a predetermined number of individual turns of a conductive wire wound progressively along a length of said CT core to define a number of winding turns, wherein the CT coil defines a winding density that varies along the length of the CT core; and
      a Rogowski current sensing transformer, defining a second opening therethrough, comprising a Rogowski core and a Rogowski coil wound therearound;
   wherein the combination current sensor is in signal communication with the trip unit, to provide electrical power and an indication of a current flow within a conductor coupled to the circuit breaker.

17. A combination current sensor comprising:
   a self-powering current transformer (CT) comprising a CT core having a CT coil wound around the CT core, the CT coil comprising a predetermined number of individual turns of a conductive wire wound progressively along a length of the CT core to define a number of winding turns, the CT coil defining a winding density that varies along the length of the CT core;

a Rogowski current sensing transformer comprising a Rogowski core and a Rogowski coil wound around the Rogowski core; and a housing defining a conductor opening extending through the housing along a central axis of the housing;

wherein the CT coil and Rogowski coil are disposed within the housing and arranged symmetrically with respect to the central axis.

* * * * *